United States Patent [19]

Shibanuma

[11] Patent Number: 4,803,689
[45] Date of Patent: Feb. 7, 1989

[54] SEMICONDUCTOR LASER MODULE
[75] Inventor: Naoki Shibanuma, Tokyo, Japan
[73] Assignee: NEC Corporation, Tokyo, Japan
[21] Appl. No.: 95,711
[22] Filed: Sep. 14, 1987
[30] Foreign Application Priority Data
Sep. 12, 1986 [JP] Japan ............................ 61-216482
[51] Int. Cl.$^4$ ............................................. H01S 3/045
[52] U.S. Cl. .................................. 372/36; 350/96.20; 357/81
[58] Field of Search ............... 372/36, 108; 350/96.18, 350/96.20; 357/81, 74

[56] References Cited
U.S. PATENT DOCUMENTS
4,615,031 9/1986 Stansted et al. ..................... 372/36
4,616,899 10/1986 Schlafer ........................... 350/96.18

FOREIGN PATENT DOCUMENTS
0113487 6/1985 Japan .................................. 372/108

Primary Examiner—James W. Davie
Attorney, Agent, or Firm—Sughrue, Mion, Zinn, Macpeak & Seas

[57] ABSTRACT

A dual-inline-package semiconductor laser package incorporating a temperature controlling Peltier element and housed in a box shape metal case having a window glass includes: the metal case having a window glass which is hermetically sealed in a side wall portion thereof; a substrate fixed on the Peltier element which is fixed in the metal case; a semiconductor laser fixed on the substrate through a chip carrier; a first lens, a light-detecting element, and a thermister fixed on the substrate; a second lens supported by a holder; an optical fiber, a portion near the distal end of which is protected by a metal sleeve; and a slide ring having an inner diameter slightly larger than an outer diameter of the metal sleeve. A side wall around the window glass of the case is bonded to the holder, the holder is bonded to the slide ring, and the slide ring is bonded to the metal sleeve.

5 Claims, 3 Drawing Sheets

SEMICONDUCTOR LASER MODULE

BACKGROUND OF THE INVENTION

The present invention relates to a semiconductor laser module and, more particularly, to a box shaped semiconductor laser module for single mode optical fiber communication, which incorporates a Peltier element.

A semiconductor laser module (to be referred to as an LD module hereinafter) is obtained by integrally assembling a semiconductor laser and a light-outputting fiber and is an essential device in an optical fiber communication technique. Especially, since a single mode fiber (to be referred to as an SMF hereinafter) is used when high-capacity, long-distance optical fiber communication is to be performed, an LD module with an SMF (to be referred to as an SMF-LD module hereinafter) is required.

Conventionally, although various types of LD modules have been developed and put into practice, the most popular LD module incorporates a temperature controlling Peltier element and is assembled in a closed case. An LD module of such a shape as shown in FIGS. 1A and 1B is manufactured by NEC Corp. Since the LD module of this type uses a dual in-line package (DIP) at its main body, it is called a DIP module and distinguished from a coaxial module to be described later. This DIP module has many advantages as follows.

First, many elements can be packaged in a single package at the same time. In addition, all the elements are sealed in a single package as a whole by hybrid packaging, i.e., an individual element is not hermetically packaged. Therefore, if the number of elements built into the package is increased, the size of the entire module can be made compact. Thus, a plurality of elements can be packaged in a single package by the DIP module while it is difficult for a coaxial module (to be described later) to do so. In such DIP module, since a temperature controlling Peltier element and a temperature detecting thermister are incorporated, variations in a threshold current and external differential quantum efficiency upon temperature changes in a semiconductor laser can be suppressed. In addition, it is assumed that along with an increase in modulation bit rate, a driving circuit must be packaged near the semiconductor laser by a hybrid packaging method.

Second, installation of the DIP module is easy. In the DIP module, a main body of a package has a box shape like that used in an integrated circuit and leads are arranged in a regular manner. Therefore, the DIP module can be easily mounted on a printed circuit board. For this reason, standardization of pin connections of the DIP module advances like that in an integrated circuit. Actually, although the DIP modules are also manufactured and used in many foreign countries, their pin connections and sizes are almost identical, so that they have interchangeability. For this reason, even if manufacturers of the DIP module are different, design of a printed circuit board need not be changed when the DIP module is packaged, resulting in extreme convenience. The coaxial module to be described later does not have such an advantage.

An internal structure of a conventional DIP module will be described in detail.

FIGS. 1A and 1B are a schematic view and a partial sectional view, respectively, showing an internal structure of a DIP module. Note that in FIGS. 1A and 1B, parts not required for explanation will be omitted and the drawings are schematically illustrated. In FIGS. 1A and 1B, a semiconductor laser 1 is mounted on a chip carrier 3' through a heat sink 2 and is further mounted together with a monitor diode 4 and a chip thermister 5 on a substrate 7'. The substrate 7' is mounted on a Peltier element 8 which is fixed on a case 9'. The carrier 3' has a fiber support portion 3'', and a quartz fiber 14' is soldered on the support portion 3'' by a low-melting solder 21. The distal end of the fiber 14' is formed to be a spherical shape, and the side surface thereof is metallized. Each element inside the case 9' is connected to a lead 22 by a bonding wire 23. The fiber 14' is protected by a coating 24, a tension member 25, and a sheath 26 outside the case 9', and is protected by a metal cylinder 15' at a position where the sheath 26 is ended. The metallized portion of the fiber 14' and the cylinder 15' are sealed with each other by soldering, and cylinder 15' and a projecting portion 11' are also sealed with each other by soldering. LD modules of this type using a multimode fiber and a single mode fiber as the fiber 14' are manufactured by many companies and widely put into practice by users in many countries with extreme convenience.

However, it is difficult to manufacture the module of the above structure due to the following reasons.

First, it is difficult to solder the fiber 14' on the support portion 3'' by the solder 21, and hence this operation requires skill. This difficulty is mainly due to the following reasons.

1 It is difficult to handle a spherical end fiber since it is liable to damage.

2 Since an operation is performed extremely near a semiconductor pellet, the pellet may be damaged if the operation is not performed carefully.

3 Since a flux cannot be used inside the case, operation conditions must be strictly controlled so that a solder fixes well with the fiber.

4 Accuracy required for aligning the semiconductor laser and the fiber is extremely severe, and this accuracy must be maintained after the fiber is fixed.

These problems are peculiar to a spherical end fiber coupling method adopted in the module of this structure. Of the above problems, problems 1 and 2 can be solved by skill. As for problem 3, an adhesive is used instead of a solder without solving the problem itself. However, when an adhesive is used inside the package in which an inert gas is hermetically sealed, an impurity gas is generated to adversely affect reliability of a semiconductor laser, and a positional relationship between the semiconductor laser and the fiber tends to be degraded due to deterioration over time of a hardened adhesive. Problem 4 is a problem inherent to the spherical end fiber coupling method. As will be described later, accuracy required for positioning is strict in the spherical end fiber coupling method as compared with other methods. In addition, since positioning accuracy is strict, positional relationship between the semiconductor laser and the fiber is degraded after the fiber is fixed due to deterioration over time of a fixing agent and the like, resulting in degradation in coupling efficiency.

The second manufacturing problem is a problem of hermetic property. In the DIP module of the structure as described above, the cylinder 15' for protecting the outer surface of the fiber and the projecting portion 11' are sealed by soldering at a portion where the fiber is guided into the case. Since a flux cannot be used during this soldering, operation conditions must be strictly controlled to maintain a hermetic property. In addition, another problem is posed when a seal test is conducted. In general, a fine leak test is conducted in addition to a gross leak test for an electronic device which should assure high reliability, but it is difficult to conduct the fine leak test for the above structure. That is, the tracer gas (usually, radio active gas or helium gas) which is absorbed by the coating of the fiber during the gas compression, disturbs the gas detection procedure, because the amount of the tracer gas from the fiber coating is far more than the leakage gas criteria. This problem is posed because hermetic sealing is not completed unless the fiber is mounted on the module main body, and this order cannot be reversed in the spherical end fiber coupling method. Therefore, this is a problem posed by coupling the method itself.

As described above, the problems of the DIP module of this structure are mainly caused by the spherical end fiber coupling method. However, the spherical end fiber coupling method is used almost without exception as a coupling method of the DIP module which incorporates the Peltier element. On the other hand, various fiber fixing methods are used in the same spherical end fiber coupling methods. These method are, for example, a method in which an adhesive is used to fix the spherical end fiber, and a method in which a metal block is soldered beforehand near the distal end of the spherical end fiber and is soldered near the semiconductor laser. The latter method includes many proposed techniques, e.g., a technique in which the Peltier element is used as a heater, a technique in which a solder is heated and melted by a YAG laser beam, and a technique in which a block incorporating an electric heating wire is mounted near the distal end of the spherical end fiber and the electric heating wire is used to heat the solder. However, in either technique, it is obvious that the above problems are not solved.

As described above, the spherical end fiber coupling method is widely used as a coupling method for the DIP module which incorporates the Peltier element although the method has the above-mentioned problems. The reasons for this will be described below.

First, the Peltier element itself is mechanically unstable. That is, a low-melting solder is normally used in assembly of the Peltier element and is also used to fix the Peltier element inside the case. As a result, the semiconductor laser to be mounted on the Peltier element is supported by a mechanically unstable means with poor reliability. In this case, in order to thermally stably maintain coupling between the semiconductor laser and the fiber which requires high accuracy for a long time period, it is simplest to move the distal end of the fiber onto the Peltier element and fix it thereon. This is because a relative positional relationship between the semiconductor laser and the fiber is not changed even if the Peltier element itself is mechanically deformed by deterioration over time to move a position of the semiconductor laser.

Second, the semiconductor laser must be thermally shielded from the outside. Assume that an optical system including the part from the semiconductor laser to the distal end of the fiber is supported by a rigid member as in a coaxial module to be described later. In this case, temperatures of only the semiconductor and a portion near it cannot be controlled since heat is conducted from peripheral portions thereof through the rigid member. On the other hand, if a temperature of the entire optical system including the rigid member is to be controlled, power consumption of the Peltier element is largely increased, and such a member cannot be housed in a small DIP package. However, in the spherical end fiber coupling method, since the Peltier element is connected to the external portion by only a quartz fiber having a small diameter, the semiconductor laser is thermally isolated well from the outside, and no problem is posed during temperature control.

In other words, the spherical end fiber coupling method is used as a coupling method of the DIP module incorporating the Peltier element because of two types of necessity, i.e., stability of optical coupling between the semiconductor laser and the fiber and thermal isolation of the semiconductor laser from the outside. Therefore, it is assumed that the above problems have been regarded as inherent defaults of the DIP module incorporating the Peltier element.

As described above, the LD modules can be classified in two types, i.e., the DIP module and the coaxial module, and the above-mentioned problems of the DIP module become more clear when compared with the coaxial module. Therefore, the coaxial module will be described as a reference in order to compare and examine these problems.

The coaxial module has been used earlier than the DIP module, in which an LD mounted and hermetically sealed in a package of a can case with a window glass is manufactured first, and then, an LD mounted a coaxial member, a lens and a fiber are fixed to each other after they are adjusted so that light emitted from the LD is efficiently coupled to the fiber. In general, since coupling between the LD and the fiber (especially the SMF) requires extremely strict positioning accuracy, coupling efficiency may vary by temperature changes, or progressively degrade according to elapsed time. However, in the coaxial module, since a structure is axially symmetrical about a central axis of the module, variation factors are canceled with itself in a sectional plane, and stable coupling can be easily obtained. This is one of the reasons why this structure was adopted in the module in earlier days. However, according to this structure, an LD assembled beforehand in a cylindrical package must be used. Therefore, it is difficult to constitute a hybrid module, in which a peripheral circuit, an element, and the like are mounted in a single package. In addition, since the shape of a module is cylindrical, mounting facility is degraded when the module is installed in communication equipment as compared with the DIP module.

Problems of the DIP module will be compared with those of the coaxial module below.

First, the coaxial module is superior to the DIP modules in easy assembly. That is, in the DIP module, the spherical end fiber is liable to damage and hence it is difficult to handle the fiber. However, in the coaxial module, since the distal end of the fiber can be protected by a metal cylinder or the like, the fiber can be easily handled. In addition, since the LD is already housed in the middle portion of the can case when the fiber is fixed, a pellet of the LD is not directly damaged. Further, although the can case is hermetically sealed, a flux can be used when the fiber is fixed by soldering. Accuracy required for positioning of the semiconductor laser and the fiber of the coaxial module is generally less strict than that of the DIP module. This will be described in detail later since detailed examination is required.

Second, the coaxial module is superior to the DIP module in terms of a hermetic property. In a semiconductor device which must have high reliability, a pellet is normally assembled and hermetically sealed in a metal can case, and this method is an already established technique. In addition, since the fiber is not mounted yet when the pellet is hermetically sealed, both the gross leak check and the fine leak check can be conducted.

A coupling method used in the coaxial module will be described below. In this coupling method, one or a plurality of lenses are arranged between the LD and the distal end of the fiber, a light beam emitted from the LD is focused through these lenses and coupled to the fiber with high efficiency. The excellent coupling method is called a "virtual fiber" coupling method. In this method, a self-focusing rod lens is adhered to the distal end of a fiber, i.e., a fiber having an effectively enlarged spot size of the mode field is used. Of the characteristics of this method, important points can be summarized as follows.

1 By adhering a self-focusing rod lens at the distal end of the fiber, the effective spot size of the fiber is enlarged, so that a tolerance with respect to an off-axial deviation is increased as compared with the case wherein a single fiber without a lens is used.

2 When a tolerance with respect to an off-axial deviation is increased by method 1, a tolerance with respect to an angle deviation is reduced, and the angular adjustment becomes difficult.

3 When the tolerance with respect to the off-axial deviation is increased by the method 1, the range of optimal positions of the distal end of the "virtual fiber" is further enlarged if a distance between the LD and the first lens (lens closest to the LD) varies.

It is obvious that the coupling method using the "virtual fiber" is superior to the method using the spherical end fiber since the tolerance with respect to the off-axial deviation can be increased. For example, assume that 0.5 dB is allowed as an increase in coupling loss. In this case, since a spot size of a near field pattern at a light-emitting point of the LD is as small as about 1 $\mu$m in the spherical end fiber, the tolerance of off-axial deviation is as very small as about 0.3 $\mu$m because it is assumed that an optimal coupling is obtained. On the contrary, in the "virtual fiber" method, since a spot size of about 5 $\mu$m of the fiber is enlarged about twice by the lens, the tolerance of the off-axial deviation is about 3 $\mu$m, i.e., increased about ten times that in the spherical fiber method.

However, by increasing the tolerance with respect to the off-axial deviation, the tolerance with respect to the angular deviation is reduced. Since the tolerance with respect to the angular deviation is very large in the spherical end fiber coupling method, angular adjustment need not be performed during positional adjustment. However, during positional adjustment in the "virtual fiber" coupling method, angular adjustment of two axes is added to 3-axis adjustment in a three-dimensional direction, i.e., 5-axis adjustment must be performed at the same time, resulting in a large obstacle in the manufacture of the module.

The problem 3 is an obstacle in design of the module. That is, since the distal end position of the fiber largely varies, a large adjustment margin matching the variations must be prepared to each module component. Therefore, the size of the module cannot be made compact. This is a drawback of the "virtual fiber" as compared with the DIP module which is made compact according to the spherical end fiber coupling method.

Thus, the method using the "virtual fiber" is advantageous since the tolerance with respect to the off-axial deviation is increased. However, the tolerance with respect to the angular deviation is reduced or the adjustment margin is increased. Therefore, an increase in tolerance with respect to the axial deviation is selected within only the limited range so as not to largely degrade a specific one of the above conditions.

As described above, although many items are required for the LD module, neither the conventional DIP module nor the conventional module satisfies these requirements. This is shown in the following Table 1.

TABLE 1

Comparison between Conventional DIP Module and Coaxial Module

|  | Conventional DIP Module | Conventional Coaxial Module |
| --- | --- | --- |
| Temperature Control of LD | Possible | Impossible |
| Installation Facility | Good | Poor |
| Mounting of Peripheral Circuit In Module | Possible | Impossible |
| Coupling Efficiency | Low | High |
| Temperature Change in Coupling Efficiency Due to Deterioration Over Time | Small | Small |
| Hermetic Property | Unsufficient | Good |
| Handling of Components during Adjustment | Difficult | Easy |
| Angular Adjustment | Unnecessary | Necessary |
| Adjustment Margin in Optical Axis Direction | Small | Large |
| Reproducibility during Fixing Fiber | Good | Good |

SUMMARY OF THE INVENTION

It is, therefore, an object of the present invention to provide a DIP module having all advantages of both the conventional DIP module and the conventional coaxial module.

A semiconductor laser module according to the present invention comprises: a case having a window glass hermetically sealed in a side wall portion thereof; a substrate fixed within the case; a semiconductor laser fixed on the substrate through a chip carrier; a first lens fixed on the substrate; a second lens supported by a holder, the holder being fixed to outside portion of the side wall; and an optical fiber fixed to the holder.

In addition, according to the present invention, the substrate has a groove in a direction perpendicular to a light beam exit direction of the semiconductor laser, the chip carrier is fixed in the groove, the substrate has a through hole having a center as a central axis of a light beam of the semiconductor laser, and the first lens is inserted in the through hole.

Further, according to the present invention, the substrate has first and second grooves in a direction perpendicular to a light beam exit direction of the semiconductor laser and has a third groove in a direction parallel to the light beam exit direction, the chip carrier is fixed in the first groove, and the first lens is a spherical lens and is fixed at an intersection between the second and third grooves.

DETAILED DESCRIPTION OF THE PREFERRED EMBODIMENTS

The present invention will be described in detail with reference to the accompanying drawings.

Figure 1A:
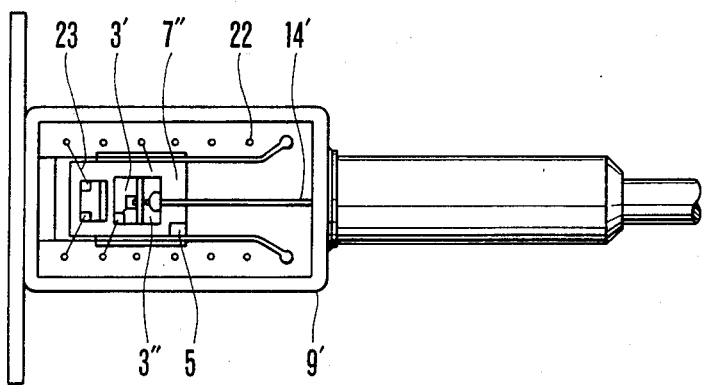
FIGS. 1A and 1B are schematic and partial sectional views, respectively, of a conventional DIP module.
Figure 1B:
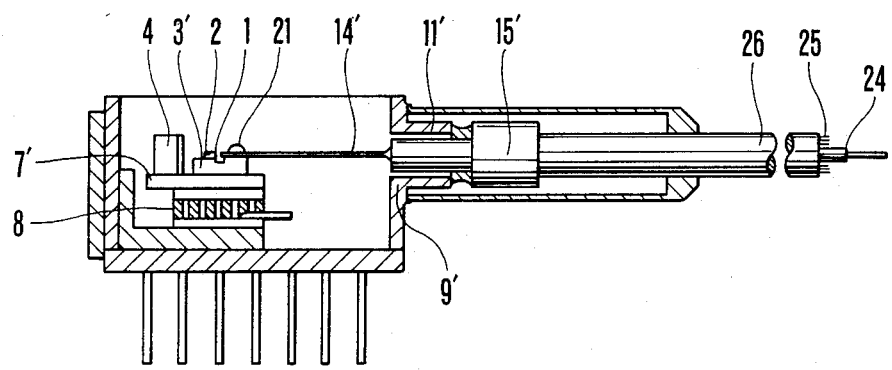
Figure 2A:
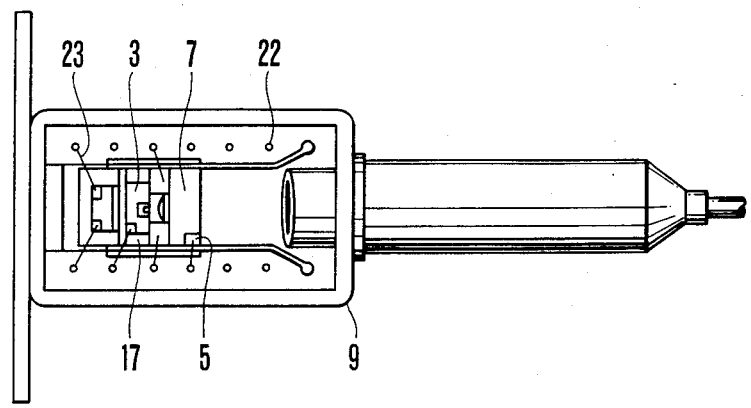
FIGS. 2A and 2B are schematic and partial sectional views, respectively, of an internal structure of an embodiment of an LD according to the present invention.
Figure 2B:
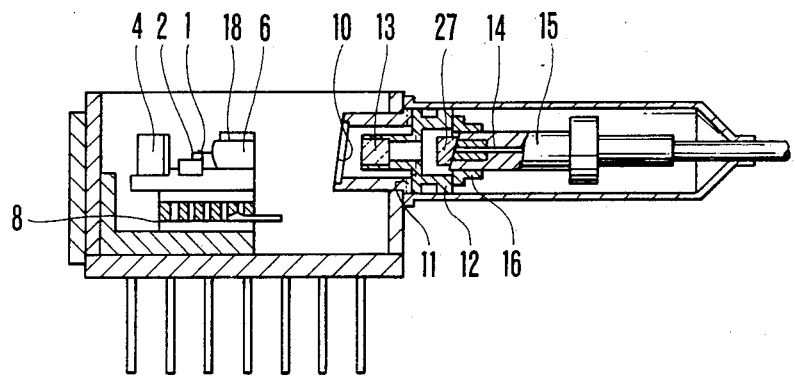

FIGS. 2A and 2B are schematic and longitudinal sectional views, respectively, of an embodiment of a semiconductor laser module according to the present invention.

In FIGS. 2A and 2B, a semiconductor laser 1 is mounted on a chip carrier 3 through a heat sink 2, and is then mounted together with a monitor diode 4, a chip thermister 5, and a lens 6 on a substrate 7. The substrate 7 is mounted by a low-melting solder on a Peltier element 8 which is fixed on a case 9 by a low-melting solder. A side wall portion of the case 9 has a window glass 10 which is hermetically sealed, and a cylindrical projecting portion 11 is provided at the side wall portion around the window glass 10 to project outwardly. A lens 13, the lateral surface of which is protected by a holder, is fixed on the distal end face of the projecting portion 11 through a holder 12. A quartz fiber 14, the lateral surface near the distal end of which is protected by a metal cylinder 15, is inserted and fixed in a slide ring 16 having an inner diameter slightly larger than an outer diameter of the metal cylinder 15, and the slide ring 16 and the holder 12 are fixed with each other on a contacting surface therebetween. A glass plate 27 is attached on the endface of the quartz fiber 14 using transparent adhesive, preventing optical reflection at the endface of the fiber which makes the operation of the laser diode unstable. In this arrangement, the distal end surface of the projecting portion 11 and the holder 12, and the holder 12 and the slide ring 16, are brought into contact with each other on a plane perpendicular to a central axis (to be referred to as an optical axis) of the quartz fiber 14, respectively, and the slide ring 16 and the metal cylinder 15 are brought into contact with each other on a cylindrical surface having the center as the optical axis.

The substrate 7 has a groove 17 in a direction perpendicular to a light beam exit direction of the semiconductor laser 1, and the chip carrier 2 is fixed in the groove 17. The substrate 7 has a through hole 18 having the center as the central axis of the light beam of the semiconductor laser 1, the lens 6 is inserted and fixed in the through hole 18.

The fact that this semiconductor laser module satisfies all the requirements shown in Table 1 will be described below.

First, the DIP module shown in FIGS. 2A and 2B incorporates the Peltier element and has the same shape as that of the conventional DIP module. Therefore, it is obvious that a temperature of the LD can be controlled and packaging is easy when the module is packaged in communication equipment. In addition, a peripheral circuit can be mounted therein.

Second, as for coupling efficiency, the same high coupling efficiency as that of the coaxial module can be obtained. In the conventional DIP module, when the tolerance is small or a fixing means of optical components has poor reliability, the tolerance must be increased by sacrificing coupling efficiency. However, in the DIP module of the present invention, since reliability does not pose any problem to be described later, coupling efficiency need not be sacrificed, resulting in high coupling efficiency.

Small deterioration over time and temperature change in coupling efficiency are important points of the LD module, and the DIP module of the present invention satisfies these requirements. As described above with reference to the conventional DIP module, since the module of this structure is fixed by a mechanically unstable means with poor reliability, deterioration over time and a temperature change in association with coupling efficiency may occur. However, this problem can be solved as follows. That is, since a spot size of the light beam between the lenses 6 and 13 is enlarged very much, the tolerance with respect to the positional deviation between the lenses 6 and 13 is largely increased. Therefore, if the positional deviation is generated to some extent between the lenses 6 and 13, a change in coupling efficiency generated thereby can be neglected. On the other hand, strict tolerances between the LD 1 and the lens 6, and between the lens 13 and the fiber 14 are required. However, since highly reliable means are used to fixing between the LD 1 and the lens 6 and between the lens 13 and the fiber 14, the positional deviation which generates a large change in coupling efficiency is not generated. That is, according to the module of the present invention, the mechanically highly reliable means are used to assemble the module at portions where the tolerance with respect to positional deviation is small. On the other hand, tolerance is increased very much at portions where means with mechanically poor reliability must be used to assemble the module. As a result, the LD module with small variations in coupling efficiency and high reliability is formed as a whole.

As for a hermetic property, according to the DIP module of the present invention, a leak test can be conducted before the fiber is fixed if the case is sealed by a cap before fixing of the fiber. Therefore, both the gross leak check and the fine leak check can be performed, thereby assuring a good hermetic property. This cannot be achieved by the conventional DIP module.

In addition, in the DIP module of the present invention, components liable to damage, such as the spherical end fiber which poses a problem in the conventional DIP module, are not used.

Finally, problems posed when a position of the fiber is adjusted and fixed will be described. When the fiber is adjusted and fixed, the following items are important. That is, 1. angle adjustment is not necessary, 2. an adjustment margin in the optical axis direction is small, and 3. reproducibility during fixing is good, i.e., coupling efficiency is not degraded by the positional deviation generated during fixing. The DIP module of the present invention can satisfy these requirements by the following assembly order.

In the first stage, the holder 12 is brought into contact with the projecting portion 11 of a module main body wherein assembly of an interior of the case is completed, as shown in FIG. 2B. Thereafter, the position of the lens 14 is adjusted in a direction perpendicular to the optical axis so that the beam exited outward through the lens 14 accurately propagates forward with respect to the module main body, and then the holder is temporarily held while maintaining the position.

Then, the position of the distal end of the quartz fiber 14, the outer surface of which is protected by the metal cylinder 15, is adjusted to be an optimal position, and then the metal cylinder 15 and the slide ring 16, and the slide ring 16 and the holder 12, are connected as shown in FIG. 2B, respectively. As a result, the holder 12, the slide ring 16, and the quartz fiber 14 are integrated to form a fiber. However, as a result of a fixing operation, the distal end position of the quartz fiber 14 once set at the optimal position is deviated in a direction perpendicular to the optical axis, thereby degrading coupling efficiency to some extent.

Finally, the holder 12 which is temporarily held is released, and after the position of the fiber formed by integrating the holder 12, the slide ring 16 and the quartz fiber 14 is adjusted in a direction perpendicular to the optical axis to recover coupling efficiency, the holder 12 is fixed to the projecting portion 11. At this time, since the tolerance is largely increased between the lenses 6 and 13 as described above, degradation in coupling efficiency generated by the positional deviation can be neglected.

As a result of the above order, all the components from the module main body to the fiber can be integrally formed and permanently fixed without degrading coupling efficiency. In this case, unlike in the coaxial module as described above, angle adjustment of components need not be performed, and a large adjustment margin is not necessary in the optical axis direction. The reason why angle adjustment need not be performed is that a direction of the light beam incident on the quartz fiber 14 is optimized when the position of the lens 13 is adjusted in the first stage. The reason why the large adjustment margin is not necessary in the optical axis direction is that only the quartz fiber 14 is independently moved without moving the lens 13 when the position of the quartz fiber 14 is adjusted in the optical axis direction. This operation is impossible in the coaxial module described above since the lens 13 is adhered and fixed to the distal end of the fiber and then adjustment is performed.

As described above, it is obvious that the semiconductor module of the present invention satisfies all the required items in Table 1.

This module has also the following characteristics.

That is, in a semiconductor laser module including a lens, high accuracy of the relative positional relationship between the LD and the lens is required so as not to degrade coupling efficiency. Although the required accuracy depends on a constant of the lens to be used, an error generally must fall within the range of several tens m in the optical axis direction and two directions perpendicular to the optical axis. In FIG. 2A, the substrate 7 has the groove 17 in a direction perpendicular to the light beam exit direction of the semiconductor laser 1, and the chip carrier 3 is fixed in the groove 17. Therefore, a position of the light-emitting point of the semiconductor laser 1 is determined by sizes of components except for a direction along the groove. The substrate 7 has also the through hole 18 having the center as the central axis of the light beam of the semiconductor 1, and the lens 6 is inserted and fixed in the through hole 18. Therefore, the position of the lens 6 with respect to the substrate is determined by sizes of components except for the optical axis. In this case, the position in the optical axis direction may be fixed using a positioning jig. As a result, the position of the chip carrier 3 on which the semiconductor laser 1 is fixed is slid along the groove 17 to be adjusted, thereby performing relative positioning between the semiconductor laser 1 and the lens 6.

Figure 3A:
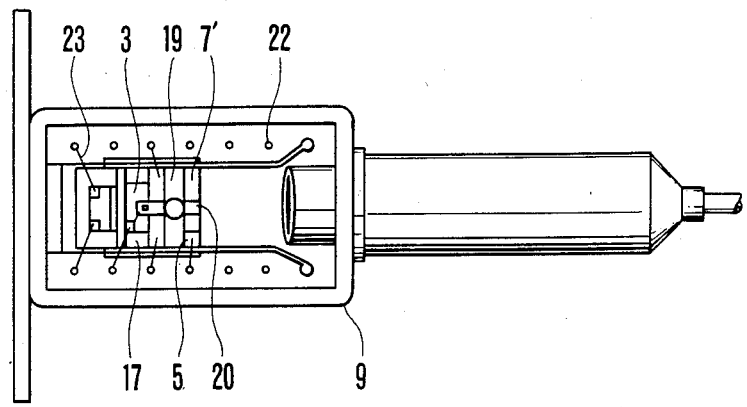
FIGS. 3A and 3B are schematic and partial sectional views, respectively, of an internal structure of another embodiment of the present invention.
Figure 3B:
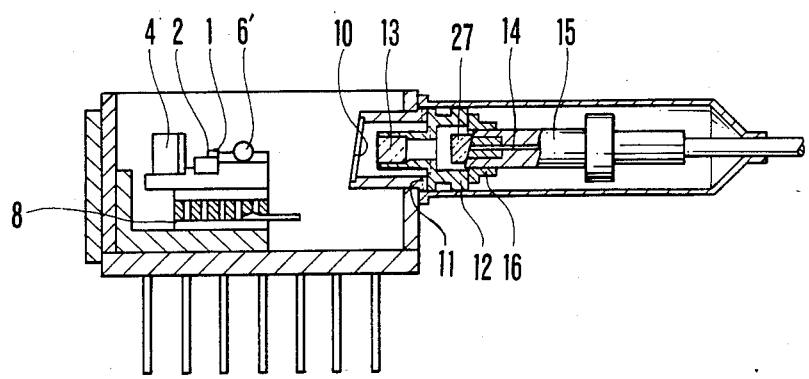

FIGS. 3A and 3B show another embodiment of the present invention. In FIGS. 3A and 3B, a substrate 7' has grooves 17 and 19 in a direction perpendicular to the light beam exit direction of the semiconductor laser 1, and has a groove 20 in a direction parallel to the light beam exit direction. The chip carrier 3 is fixed in the groove 17, and a spherical lens 6' is fixed at an intersection between the grooves 19 and 20. Other arrangements are similar to those of the embodiment shown in FIGS. 2A and 2B.

From the above description, it is obvious that this DIP module satisfies all the requirements shown in Table 1. The embodiment of FIGS. 3A and 3B differs from that of FIGS. 2A and 2B such that the lens 6' is fitted in and fixed at the orthogonal intersection between the two grooves performed on the substrate. At this time, if the width of each of the two grooves coincides with a value obtained by multiplying a diameter of the lens 6' by 2, the lens 6' is automatically positioned with respect to the substrate 7'.

This embodiment as compared with the embodiment shown in FIGS. 2A and 2B has advantages in easy manufacture and low cost. More specifically, the following three advantages can be obtained.

1. Since only the grooves are cut when the substrate 7' is formed, a highly accurate inexpensive component can be obtained.

2. The spherical lens is inexpensive as compared with other lenses and advantageous in manufacturing accuracy.

3. Since the lens 6' is automatically positioned with respect to the substrate 7', assembly can be simplified.

As has been described above, the semiconductor laser module according to the present invention is advantageous in coupling efficiency between the semiconductor laser and the optical fiber, in stability against deterioration over time and a temperature change in coupling, and in operability during assembly.

What is claimed is:

1. A semiconductor laser module, in which a semiconductor laser and a Peltier element for controlling a temperature of said semiconductor laser are mounted in a box shaped metal case, and which has a light-outputting fiber, a portion near distal end of which is protected by a metal cylinder, comprising: said metal case having a window glass which is hermetically sealed in a side wall portion thereof; a substrate fixed on said Peltier element which is fixed in said metal case; said semiconductor laser fixed on said substrate through a chip carrier; a first lens, a light-receiving element, and a thermister fixed on said substrate; a second lens, an outer surface of which is supported by a holder bonded to said side wall around said window glass of said case; and a slide ring having an inner diameter slightly larger than an outer diameter of said metal cylinder, said slide ring being bonded to said holder, and said metal cylinder being bonded to said slide ring.

2. A module according to claim 1, wherein said substrate has a groove in a direction perpendicular to a light beam exit direction if said semiconductor laser, said chip carrier is fixed in said groove, said substrate has a through hole having a center as a central axis of a light beam of said semiconductor laser, and said first lens is inserted in said through hole.

3. A module according to claim 1, wherein said substrate has first and second grooves in a direction perpendicular to a light beam exit direction of said semiconductor laser and has a third groove in a direction parallel to the light beam exit direction, said chip carrier is fixed in said first groove, and said first lens is a spherical lens and is fixed at an intersection between said second and third grooves.

4. A semiconductor laser module, in which a semiconductor laser and a Peltier element for controlling a temperature of said semiconductor laser are mounted in a box shaped case, and which has a light-outputting fiber, a portion near distal end of which is protected by a cylinder, comprising: said case having a window glass which is hermetically sealed in a side wall portion thereof; a substrate fixed on said Peltier element which is fixed in said case; said semiconductor laser fixed on said substrate; a first lens fixed on said substrate; a second lens, an outer surface of which is supported by a holder bonded to said side wall around said window glass of said case; and a slide ring having an inner diameter slightly larger than an outer diameter of said cylinder, said slide ring being bonded to said holder, and said cylinder being bonded to said slide ring.

5. A semiconductor laser module, in which a semiconductor laser is mounted in a box shaped case, and which has a light-outputting fiber, a portion near distal end of which is protected by a cylinder, comprising: said case having a window glass which is hermetically sealed in a side wall portion thereof, said window glass being supported by a cylindrical portion projecting from the side wall portion into the inner side of said case; a substrate fixed in said case; said semiconductor laser fixed on said substrate; a first lens fixed on said substrate; a second lens positioned in said cylindrical portion, an outer surface of said second lens is supported by a holder bonded to said side wall around said window glass of said case; and a slide ring having an inner diameter slightly larger than an outer diameter of said cylinder, said slide ring being bonded to said holder, and said cylinder being bonded to said slide ring.

* * * * *